(12) United States Patent
Kraemer et al.

(10) Patent No.: US 11,169,185 B2
(45) Date of Patent: Nov. 9, 2021

(54) PASSIVE CURRENT SENSOR WITH SIMPLIFIED GEOMETRY

(71) Applicant: TE Connectivity Germany GmbH, Bensheim (DE)

(72) Inventors: Christoph Kraemer, Mannheim (DE); Gerhard Riedl, Stutensee-Friedrichsthal (DE); Thimo Paulus, Mannheim (DE); Sven Faas, Karlsruhe (DE); Michael Pichler, Neuburg (DE)

(73) Assignee: TE CONNECTIVITY GERMANY GMBH, Bensheim (DE)

( * ) Notice: Subject to any disclaimer, the term of this patent is extended or adjusted under 35 U.S.C. 154(b) by 0 days.

(21) Appl. No.: 16/818,549

(22) Filed: Mar. 13, 2020

(65) Prior Publication Data

US 2020/0292589 A1    Sep. 17, 2020

(30) Foreign Application Priority Data

Mar. 14, 2019 (DE) .......................... 102019203498.5

(51) Int. Cl.
| | |
|---|---|
| G01R 19/00 | (2006.01) |
| G01R 1/04 | (2006.01) |
| G01R 1/20 | (2006.01) |
| G01R 19/32 | (2006.01) |
| H02B 1/20 | (2006.01) |

(52) U.S. Cl.
CPC ........... *G01R 19/0092* (2013.01); *G01R 1/04* (2013.01); *G01R 1/203* (2013.01); *G01R 19/32* (2013.01); *H02B 1/20* (2013.01)

(58) Field of Classification Search
None
See application file for complete search history.

(56) References Cited

U.S. PATENT DOCUMENTS

| | | | | |
|---|---|---|---|---|
| 6,304,062 | B1* | 10/2001 | Batson | .................... G01R 1/203 320/134 |
| 2008/0030208 | A1* | 2/2008 | Aratani | .................... G01R 1/203 324/713 |
| 2008/0050985 | A1* | 2/2008 | Roset | .................... G01R 31/364 439/754 |
| 2010/0108836 | A1* | 5/2010 | Miller | .................... B60L 53/20 248/220.21 |
| 2019/0204367 | A1* | 7/2019 | Frenzel | .................... G01R 1/44 |

* cited by examiner

*Primary Examiner* — Jas A Sanghera (57) ABSTRACT

A passive current sensor includes a pair of electrically conductive busbars, a shunt resistor electrically connecting the busbars, and a carrier having a first pair of voltage drop measuring contacts. At least one of the voltage drop measuring contacts is attached to each of the busbars and forms a direct electrical contact between the at least one voltage drop measuring contact and the busbar.

21 Claims, 10 Drawing Sheets

PASSIVE CURRENT SENSOR WITH SIMPLIFIED GEOMETRY

CROSS-REFERENCE TO RELATED APPLICATION

This application claims the benefit of the filing date under 35 U.S.C. § 119(a)-(d) of German Patent Application No. 102019203498.5, filed on Mar. 14, 2019.

FIELD OF THE INVENTION

The present invention relates to a current sensor and, more particularly, to a passive current sensor.

BACKGROUND

Passive current sensors are used to measure a voltage drop at a shunt resistor. These current sensors are used, for example, in automotive engineering in the area of electrically powered vehicles. In these vehicles, such a passive current sensor is used to measure the flowing current, i.e. a current intensity. The shunt resistor is inserted between two electrically conductive busbars. The shunt resistor has a very low resistance value, which is, however, sufficiently high to be able to measure a voltage drop on both sides of the shunt resistor. Usually the resistance value of a shunt resistor is in the range of a few tens of microohms.

The busbars interconnected by the shunt resistor are contacted by contacts of a printed circuit board (PCB) soldered to the busbars. On such a PCB there are corresponding conductor tracks and connections to which plug-in contacts can be soldered for tapping the measured voltage signals (the voltage drop at the shunt resistor). The electrical plug contacts are connected indirectly via the PCB by soldering to the busbar or busbars. Such a soldered connection is not high-strength and has little resistance to aging and, furthermore, due to the PCB, a quality of the soldered connection cannot be easily tested.

SUMMARY

A passive current sensor includes a pair of electrically conductive busbars, a shunt resistor electrically connecting the busbars, and a carrier having a first pair of voltage drop measuring contacts. At least one of the voltage drop measuring contacts is attached to each of the busbars and forms a direct electrical contact between the at least one voltage drop measuring contact and the busbar.

BRIEF DESCRIPTION OF THE DRAWINGS

The invention will now be described by way of example with reference to the accompanying Figures, of which.

DETAILED DESCRIPTION OF THE EMBODIMENT(S)

In the following, the invention is explained in more detail with reference to the embodiments shown in the drawings. Identical technical features and technical features with the same function are given the same reference signs. Repeated descriptions are avoided as far as possible and differences are especially emphasized. The embodiments shown in the figures are purely exemplary and are not intended to restrict the present invention to the embodiments shown. The technical features of individual embodiments can be combined with each other in any combination and can also be omitted in special embodiments, provided that the technical effect achieved with the omitted technical feature is not important in a particular embodiment.

Figure 1:
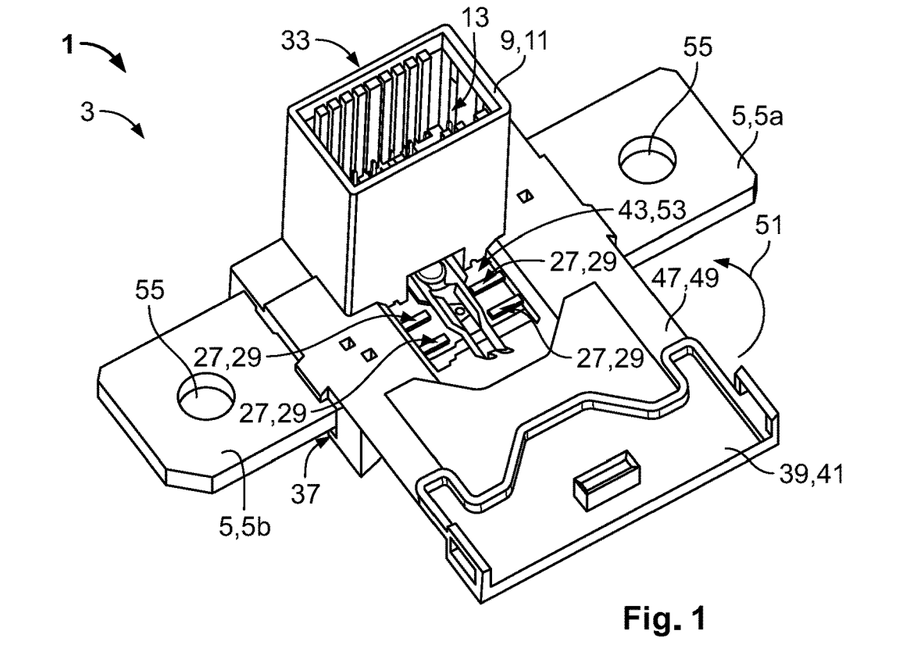
FIG. 1 is a perspective view of a passive current sensor according to an embodiment.

A passive current sensor 1 according to an embodiment is shown in a preassembly position 3 in FIG. 1. The passive current sensor 1 comprises a pair of electrically conductive busbars 5 which are electrically and mechanically interconnected by a shunt resistor 7. The shunt resistor 7 is indicated, for example, in FIG. 2 and can be seen in particular in FIGS. 3, 7, and 8. The passive current sensor 1 has a carrier 9 which, in the embodiments shown, is configured as a housing 11.

Figure 2:
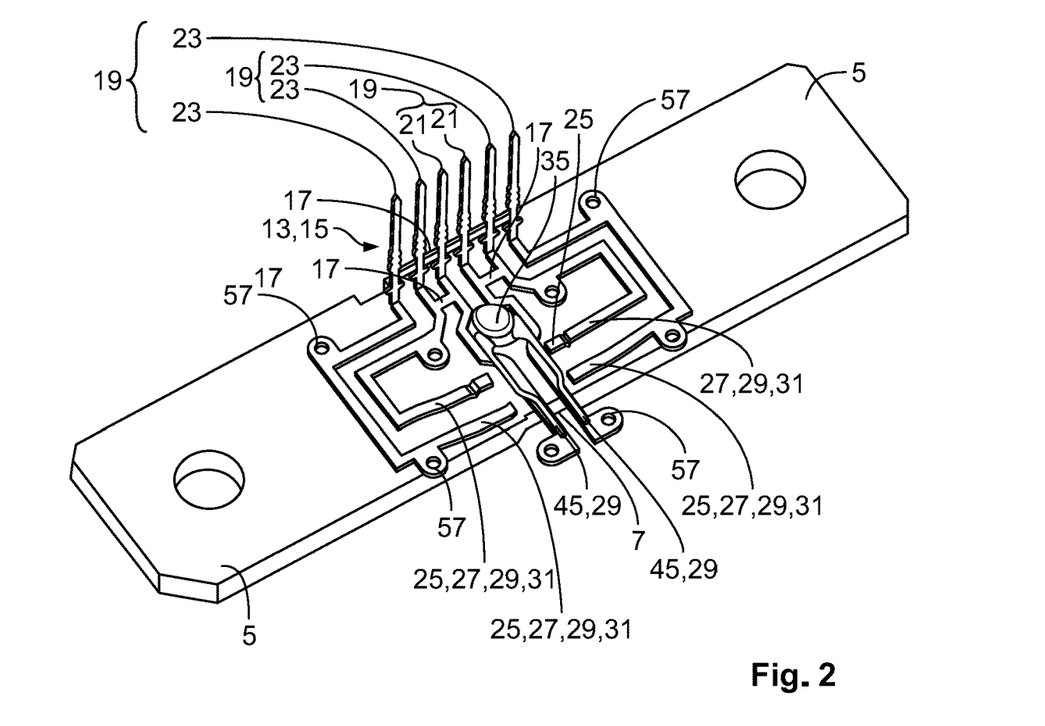
FIG. 2 is a perspective view of the passive current sensor of FIG. 1 without a housing.

For the sake of clarity, FIG. 2 does not show the carrier 9 or the housing 11. A multiplicity of contact pins 13 can be seen, which are arranged in a punched grid 15 and are spaced apart from and oriented toward one another. During insertion into the housing 11, only the punched grid 15 is inserted in its entirety and it is not necessary to individually insert the individual contact pins 13 into the housing 11. The contact pins 13, in an embodiment, are pins which can be received and firmly secured in the housing 11 via a press fit or a barb-like catch mechanism. The punched grid 15 has connecting struts 17; in the shown embodiment, for the sake of clarity, only four connecting struts 17 are denoted with a reference sign.

The contact pins 13 are provided in pairs, as shown in FIGS. 1 and 2, with a pair 19 of temperature measuring contacts 21 and two pairs 19 of voltage drop measuring contacts 23.

Each of the voltage drop measuring contacts 23 is connected to the busbar 5 at at least one connecting section 25 of the corresponding voltage drop measuring contact 23. A connection 27 at the connecting section 25 is a direct electrical and mechanical connection 29, i.e., the voltage drop measuring contacts 23 are fastened directly and immediately to the corresponding busbar 5 without an interposed element. This is achieved, for example, by a solder or welded connection 31, such as a cold solder joint. Alternatively, the connection 27 can be integrally bonded, frictionally engaged, or any type of electrical or mechanical connection.

The connecting section 25 can be aligned in a defined manner pointing away from the voltage drop measuring contact 23 in the direction of the busbar 5. If the voltage drop measuring contact 23 is a punched part, such a connecting section 25 can be produced by bending a section of the voltage drop measuring contact 23. The connecting section 25 can be located at a free end of the voltage drop measuring contact 23 or in a central area. In the latter case, the voltage drop measuring contact 23 thus has a bulge deflected convexly in the direction of the busbar 5. Such a connecting section 25 can be formed by a welding spot accessible from outside the housing 11. The temperature measuring contact 21 can form a temperature contacting section which can alternatively or additionally have at least one welding spot.

A voltage potential present applied at the voltage drop measuring contacts 23 can be tapped on both sides of the shunt resistor 7, and a voltage difference between the voltage drop measuring contacts 23 can be determined. The voltage tapped on both sides of the shunt resistor 7 is present at every point on the corresponding busbar 5. In a circuit diagram, a dropping voltage across this resistor 7 is tapped by the voltage drop measuring contacts 23 parallel to the shunt resistor 7 and made available via the ohmic law for further processing for determining the current flowing through the resistor 7. It is made available via the contact pins 13 which are received in the housing 11. The contact pins 13 are attached to the busbar 5 in the vicinity of the shunt resistor 7 because the voltage drop that occurs at the shunt resistor 7 is the desired measured variable to be tapped.

Apart from the connecting sections 25, the elements of the voltage drop measuring contacts 23 can particularly be arranged in a plane which is arranged parallel to the busbar 5 in an embodiment. This distance can be ensured by the carrier or in a further embodiment by a housing which keeps the received voltage drop measuring contacts 23 at precisely this distance from the busbars 5. Only the connecting sections 25 can extend exactly by this distance in the direction of and mechanically contact the busbar 5. The connecting sections 25 can thus already contact the busbars 5 before the connecting sections 25 are directly electrically and mechanically fastened to the busbars 5. The connecting section 25 can be produced in a simple manner by bending or punching during the course of the punching process for producing the punched grid.

The two pairs 19 of voltage drop measuring contacts 23 can be provided for reasons of redundancy. The voltage drop determined via a first pair of contact pins 13 can thus be checked and/or validated. A defect in the connection to the busbars 5 or in the contact pin 13 can thus be detected. In such case, the pairs 19 can be distinguishable or indistinguishable.

Furthermore, one or more connecting struts 17, which are located between the voltage drop measuring contacts 23 of one of the busbars 5, can be retained. Connecting struts 17, which connect voltage drop measuring contacts fastened to different busbars 5, are, in accordance with the method according to the invention, to be severed before the passive current sensor 1 is used. The same applies to connecting struts 17 which are present between the temperature measuring contacts 21 or between a temperature measuring contact 21 and a voltage drop measuring contact 23.

The temperature measuring contacts 21 can be assigned to the shunt resistor 7 and can be positioned closer to the shunt resistor 7 than to the busbars 5. An insulating material bridge can be provided between the shunt resistor 7 and the temperature measuring contact 21, which, for example, comprises air. The temperature sensor 35 is electrically connected to the temperature measuring contacts 21 and positioned in the vicinity of the shunt resistor 7. Neither the temperature measuring contacts 21 nor the temperature sensor 35 itself are allowed to be in electrical contact with the busbars 5 or the shunt resistor 7. The temperature measuring contacts 21 are spaced apart from the busbars 5 and the shunt resistor 7 or provided with an electrical insulator.

The busbars 5 can be referred to as the first busbar 5a and as the second busbar 5b, shown in FIG. 1, wherein the sequence of this designation is chosen arbitrarily. The busbars 5 can have fastening openings 55 for fastening the busbars 5. Options for fastening busbars 5 are known from the prior art and shall not be further described herein. In each pair 19 of voltage drop measuring contacts 23, one contact 23 can be directly electrically and mechanically connected to the first busbar 5a, and a second contact 23 can be directly electrically and mechanically connected to the second busbar 5b.

In an embodiment, the busbars 5 are flat, elongated cuboids which have a thickness that is less than their width and also have a width that is less than their length. The cross-section of the busbars 5 is rectangular in an embodiment. For a low-loss power line, the busbars 5 are frequently made of a material with high electrical conductivity, such as metal. For example and nonrestrictively, the busbar 5 can be made of copper.

The housing 11 of the embodiment of the passive current sensor 1 shown in FIG. 1 also has a plug face 33, in which the contact pins 13 are received and/or fastened. A voltage drop occurring at the shunt resistor 7 as well as a resistance value of a temperature sensor 35 can thus be tapped in a simple manner via the plug face 33. Because the voltage drop across the shunt resistor 7 is not only dependent on the current flowing through it, but also shows a dependence on the temperature of the shunt resistor 7, the temperature of the shunt resistor 7 is determined for correctly determining the flowing current.

The temperature sensor 35 is arranged at a distance from the busbars 5 which are at a certain voltage level, and which prevents electrical crosstalk. In particular, the distance is greater than the creepage distance. Furthermore, an electrically insulating material, for example, in the form of an air gap, a film, or a liquid, can be provided between the busbars 5 and the temperature sensor 35 and the temperature measuring contacts 21. An insulating material which has a higher thermal conductivity than air is used in an embodiment, which ensures that the temperature is effectively transferred from the shunt resistor 7 to the temperature sensor 35, wherein adequate insulation and thus protection against electrical crosstalk and/or a falsified measurement is still provided.

The housing 11 of the passive current sensor 1 shown in FIG. 1 also has a receiving link 37, shown in FIGS. 3, 8, and 9-11. The busbars 5 are received in the housing 11 by the receiving link 37.

The housing 11 further comprises an access protection 39 shown in FIG. 1 that, in the embodiment shown, is configured as a cover element 41. With the access protection 39, it is possible to cover an access recess 43 at least in sections and to prevent access to elements accessible through the access recess 43, such as the connecting sections 25, the direct electrical and mechanical connections 29, and the temperature sensor 35.

The connection 27 of the temperature sensor 35 to temperature contacting sections 45 is also covered by the access protection 39. The temperature contacting sections 45 differ from the connecting sections 25 of the voltage drop measuring contacts 23, in that they are electrically insulated from the busbars 5 and the shunt resistor 7. A direct electrical and mechanical connection 29 can also be provided at the temperature contacting sections 45, but in this case between the temperature sensor 35 and the associated temperature contacting section 45 of the corresponding temperature measuring contact 21.

The cover element 41 of the embodiment shown is connected to a remaining part of the housing 11 by a connecting element 49 configured as a film hinge 47, as shown in FIG. 1. In some configurations of the passive current sensor 1, the film hinge 47 can have a flexibility which allows the cover element 41 with the attached film hinge 47 to be folded in a rotational movement 51 toward the access recess 43 and to close the access recess 43. However, in other configurations, the material of the housing 11 can be too brittle for such a movement and require the connecting element 49 to be separated before the access recess 43 is closed with the cover element 41.

In the embodiment shown in FIG. 1, the access recess 43 is a sensor access recess 53, i.e., the connecting sections 25 as well as the temperature contacting sections 45 and the temperature sensor 35 itself are accessible via a single recess.

Figure 9:
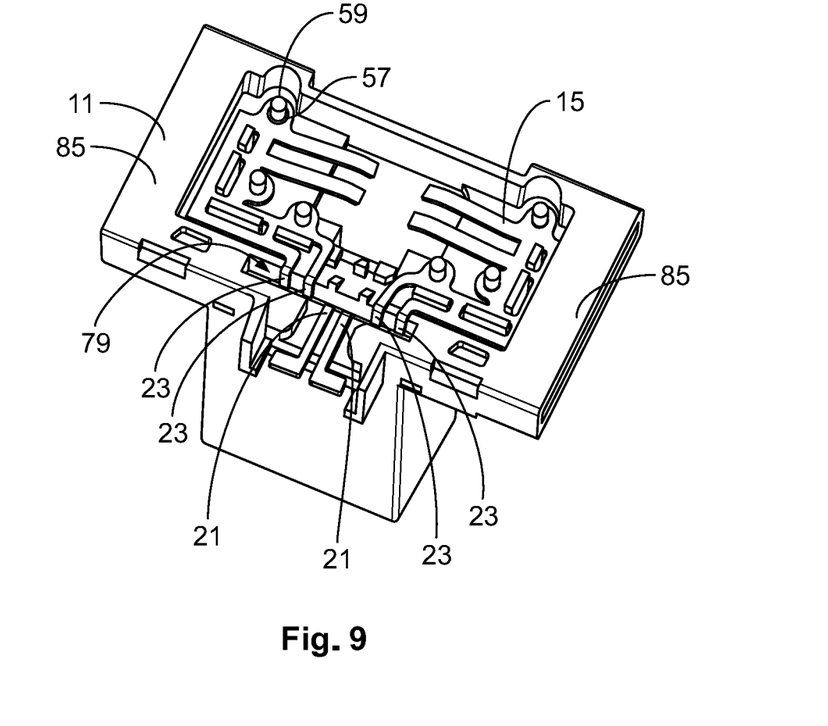
FIG. 9 is a perspective view of a first step of assembling the passive current sensor according to an embodiment.

The punched grid 15 of FIG. 2 further shows fixing eyelets 57; for the sake of clarity, only a few are denoted with a reference sign. The fixing eyelets 57 are used to securely fasten and/or position the punched grid 15 in the housing 11 by fixing pins 59 protruding through the fixing eyelets 57, as shown in FIG. 9.

Figure 3:
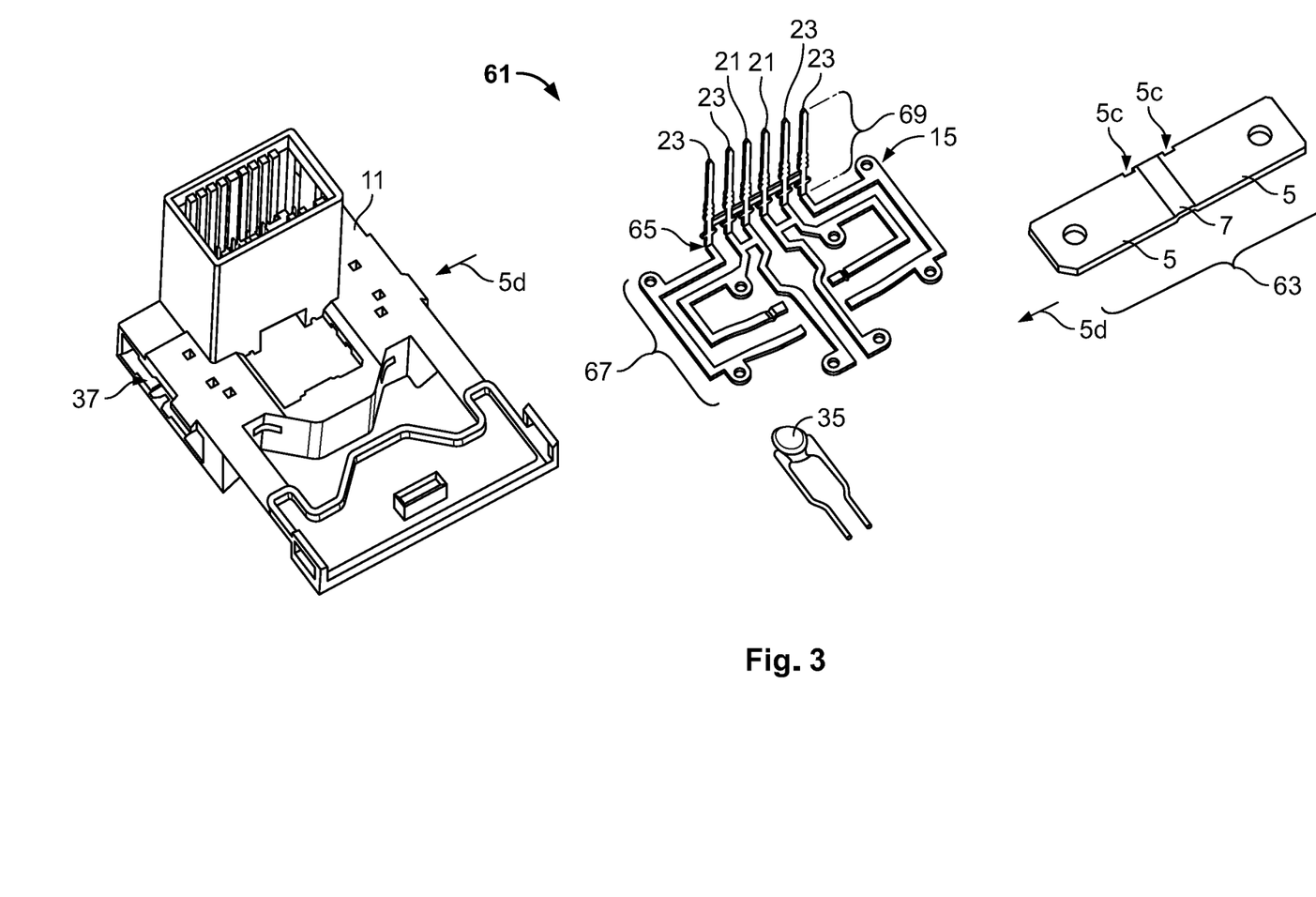
FIG. 3 is an exploded perspective view of an assembly for assembling a passive current sensor according to an embodiment.

FIG. 3 shows an assembly 61 for assembling the passive current sensor 1. The assembly 61 comprises the housing 11, the punched grid 15 including, in the embodiment shown, four voltage drop measuring contacts 23 and two temperature measuring contacts 21, the temperature sensor 35, and a shunt element 63. The shunt element 63, in the shown embodiment, is to be understood as a one-piece element, including the two busbars 5 and the shunt resistor 7. In other configurations of the assembly 61 according to the invention, it is possible that such a shunt element 63 is not present.

FIG. 3 further shows notches 5c in the shunt element 63, which are used for the play-free engaging of the shunt element 63 in the housing 11. For safety purposes, the lock mechanism was designed redundantly; functionally, one notch 5c is sufficient. The punched grid 15 has a bending area 65 which connects a busbar contacting area 67 to a plug connection area 69. Both areas 67, 69 are arranged at an angle of 90° to one another in the shown embodiment but can be aligned to one another at any angle.

The bending area 65 can be produced after the contact pins 13, i.e., for example, the voltage drop measuring contacts 23 and the temperature measuring contacts 21, have been punched out. The entire punched grid is bent in an embodiment. In this case, the busbar contacting area 67 can be aligned essentially parallel to the busbar 5 and, in an embodiment, the busbar contacting area 67 and the plug connection area can enclose an angle of approximately or exactly 90°. The connecting sections 25 can thus be arranged in the busbar contacting area 67, wherein pin-shaped free ends of the voltage drop measuring contacts 23 and/or the temperature measuring contacts 21 can be arranged in the plug connection area. 69 The busbar contacting area 67 and the plug connection area 69 can be at any angle to one another. The bending area 65 can be understood as the knee of the respective contact pins 13 located in this area.

Figure 4:
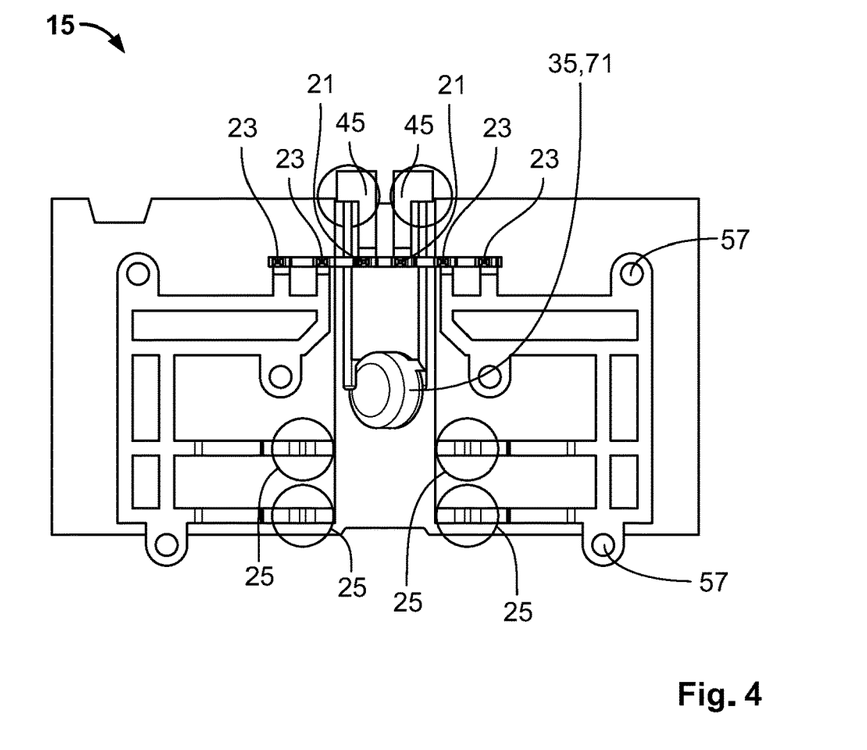
FIG. 4 is a plan view of a punched grid according to an embodiment.
Figure 5:
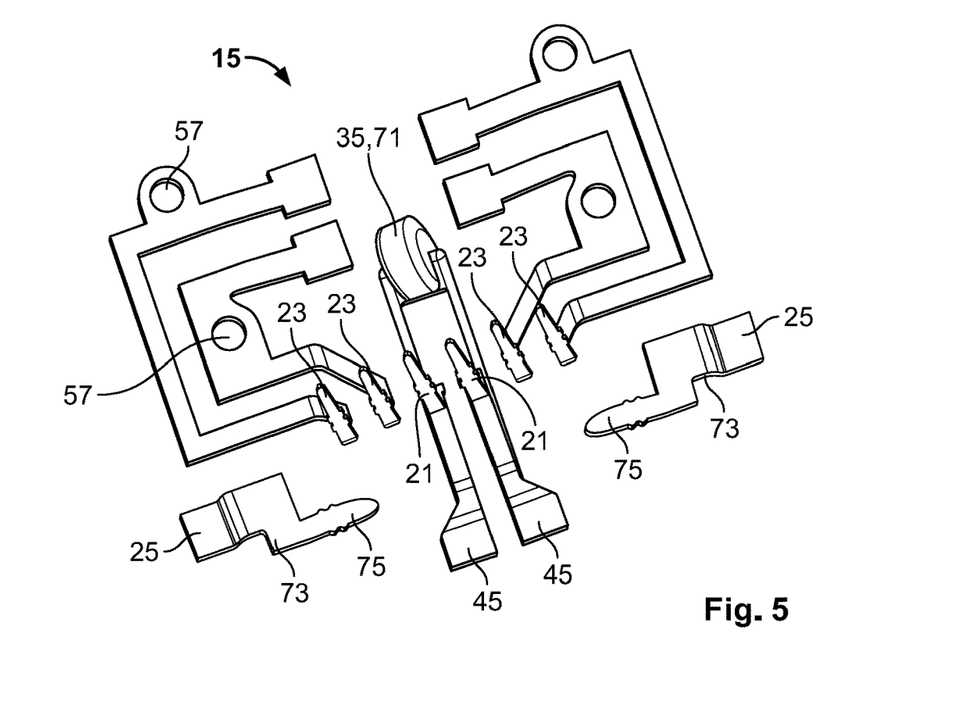
FIG. 5 is a perspective view of a punched grid according to another embodiment.
Figure 6:
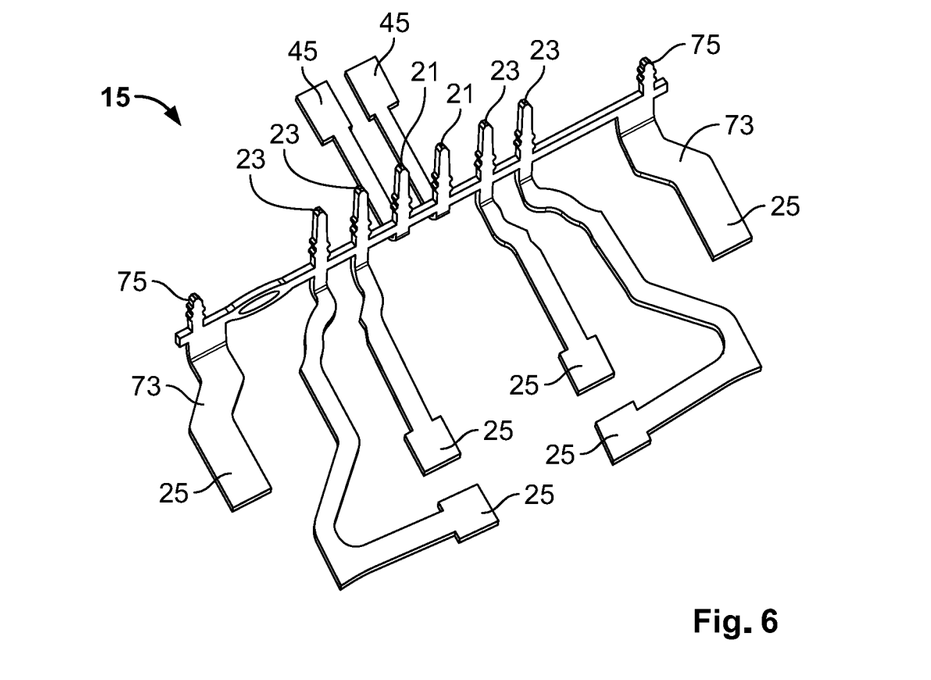
FIG. 6 is a perspective view of a punched grid according to another embodiment.

The passive current sensor 1 according to the invention can have punched grids 15 of different designs; three further possible embodiments are shown in FIGS. 4-6. The punched grids 15 each have four voltage drop measuring contacts 23, two temperature measuring contacts 21, and the corresponding connecting sections 25 and temperature contacting sections 45.

In the embodiments of the punched grid 15 of FIGS. 4 and 5, one temperature sensor 35 each is connected to the temperature contacting sections 45 of the corresponding temperature measuring contacts 21. The depicted temperature sensor 35 is an NTC temperature sensor 71 in an embodiment, but can be any temperature sensor, such as a PTC resistor, an SMD component, or a wired temperature sensor. Furthermore, the embodiments of the punched grid 15 shown in FIGS. 4 and 5 have fixing eyelets 57. In this case, any geometry, position, and number of fixing eyelets 57 can be selected.

In FIGS. 5 and 6, the punched grid 15 also has two blind pins 73. They also have connecting sections 25 but do not open into a contact pin 13; instead, they open into a fastening pin 75, which is not provided for electrical contacting but merely ensures mechanical stabilization of the housing 11 with respect to the shunt element 63.

The blind pins 73 can be provided for mechanically immobilizing the position of the housing 11, the blind pins 73 are mechanically connected to a busbar 5 and to the carrier 11. For a mechanical connection of the blind pin 73 to the busbar 5, they are attached, for example, welded, to the busbars 5. In another embodiment, the blind pins 73 engage in boreholes which are configured in the busbars 5 and are held in the boreholes by a frictional connection or a catch mechanism. The contacting or positional immobilizing by a connection to the housing 11 can take place, for example, in the form of a plug contact or a snap-in element. Thus, the voltage drop measuring contacts 23 and/or the temperature measuring contacts 21 as well as the blind pins 73 are received in the housing 11 or securely fastened in or on the housing 11. The housing 11 is then positioned at and fastened to at least one busbar 5, and in the subsequent step, the contact pins 13 provided in the corresponding embodiment, i.e., the voltage drop measuring contacts 23, the temperature measuring contacts 21, or the blind pins 73, are fastened to the busbar 5. According to the invention, this takes place directly, i.e., without a further interposed element.

Figure 7:
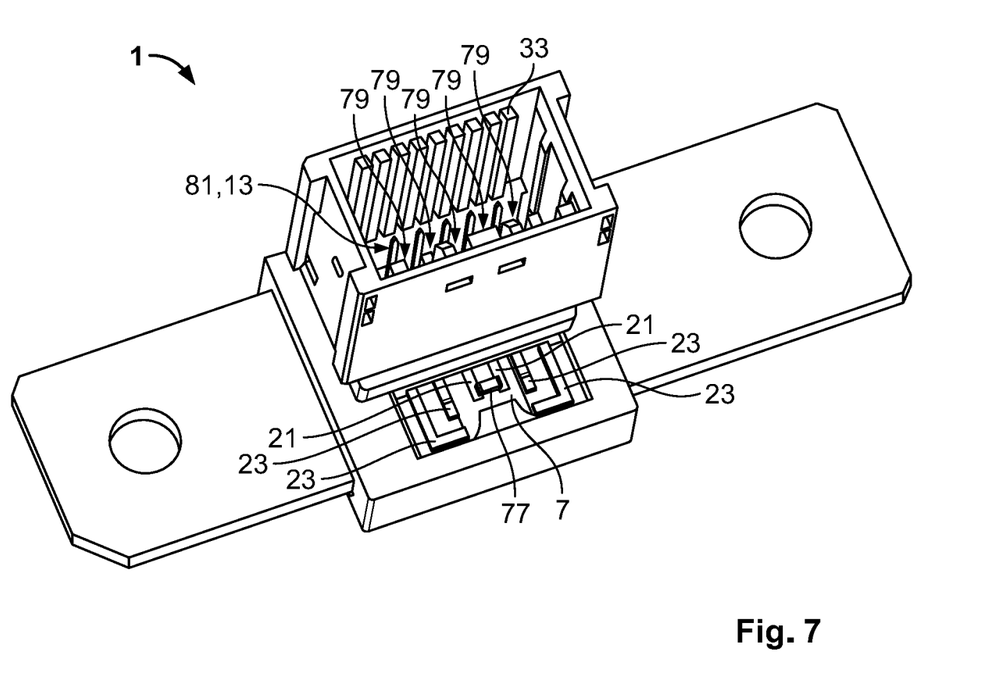
FIG. 7 is a perspective view of a passive current sensor according to another embodiment.

A passive current sensor 1 according to another embodiment is shown in FIG. 7. In addition to the four voltage drop measuring contacts 23, the passive current sensor 1 of FIG. 7 has an SMD temperature sensor 77 which is fastened to the temperature measuring contacts 21 but simultaneously positioned electrically insulated from the shunt resistor 7. In the simplest case, this is ensured by the SMD temperature sensor 77 being spaced apart from the shunt resistor 7. Also shown is the plug face 33, in which the contact pins 13 are received in pin receiving openings 79 of the housing 11. The contact pins 13 are designed as plug contacts 81 in the shown embodiment, this has the advantage that the contact pins 13 can be received in the housing 11 in a guided manner and additionally securely fastened in their position by the housing 11. The pin receiving openings 79 may also be referred to as contact chambers and the housing 11 may also be referred to as a pin contact housing.

Figure 8:
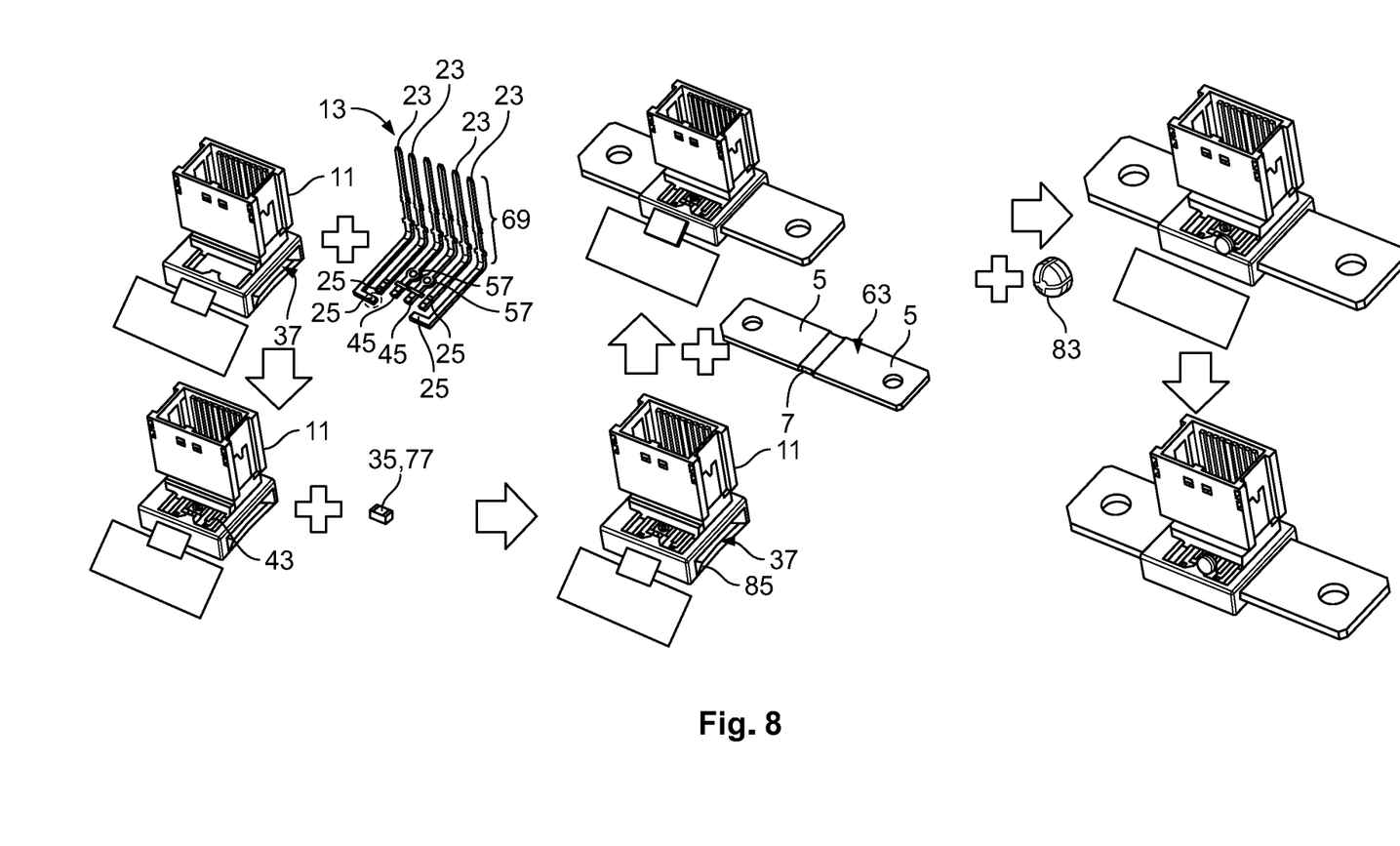
FIG. 8 is a schematic diagram of a method for assembling a passive current sensor.

The assembly of the passive current sensor 1 is shown in FIG. 8. The method begins with a first method step at the upper left-hand side of the drawing and follows the depicted arrows.

First, as shown in FIG. 8, the contact pins 13, or more precisely, the plug connection area 69 of the contact pins 13, including at least two voltage drop measuring contacts 23, are received in the housing 11. For that purpose, the contact pins 13 can be firmly inserted into the housing 11 and additionally fastened to the housing 11 by fixing eyelets 57.

A temperature sensor 35 designed as an SMD temperature sensor 77 is subsequently attached with the temperature measuring contacts 21 to the temperature contacting section 45 via the access recess 43, as shown in FIG. 8.

The shunt element 63 is then inserted laterally into the receiving link 37 of the housing 11 until the temperature sensor 35 is located above the shunt resistor 7, as shown in FIG. 8. If this is the case, the four voltage drop measuring contacts 23 in the embodiment shown are directly electrically and mechanically connected to the two busbars 5 by their connecting sections 25. Subsequently, a heat conducting material 83 can additionally be fitted between the temperature sensor 35 and the shunt resistor 7. Such a heat conducting material 83 has a high thermal conductivity, whereas it has an electrically insulating effect.

FIGS. 9-12 show a bottom view of the passive current sensor 1 in different method steps. In FIG. 9, the punched grid 15 is inserted into the housing 11. In the housing 11, it is secured against movement, which can be realized by plugging the voltage drop measuring contacts 23 and the temperature measuring contacts 21 into the corresponding pin receiving openings 79 of the housing 11. Furthermore, the immobilization of the punched grid 15 is supported by the fixing eyelets 57 described above and the fixing pins 59 of the housing 11 received therein.

The depicted housing 11 has an undercut element 85 which completely encloses a busbar 5 to be received, as shown in FIGS. 8 and 9. The undercut element 85, at least in sections, is designed to be complementary to the busbar 5, and in which the busbar 5 can be guided. The undercut element 85 can thus have an L-shaped cross-section, extend along a lateral surface of the busbar 5, and engage from behind in the busbar 5 with an undercut section on the side of the busbar 5 opposite the carrier or housing 11. A further embodiment of an undercut element 85 is a closed receiving opening which not only in sections but also entirely encompasses and engages the busbar 5 from behind at its lateral surfaces. The undercut elements 85, in an embodiment, are provided in pairs facing one another. In order to fasten the housing 11 with one or more undercut elements 85 to the busbar 5, it is necessary to move it into the receiving opening or receiving link formed by the undercut elements 85.

Figure 10:
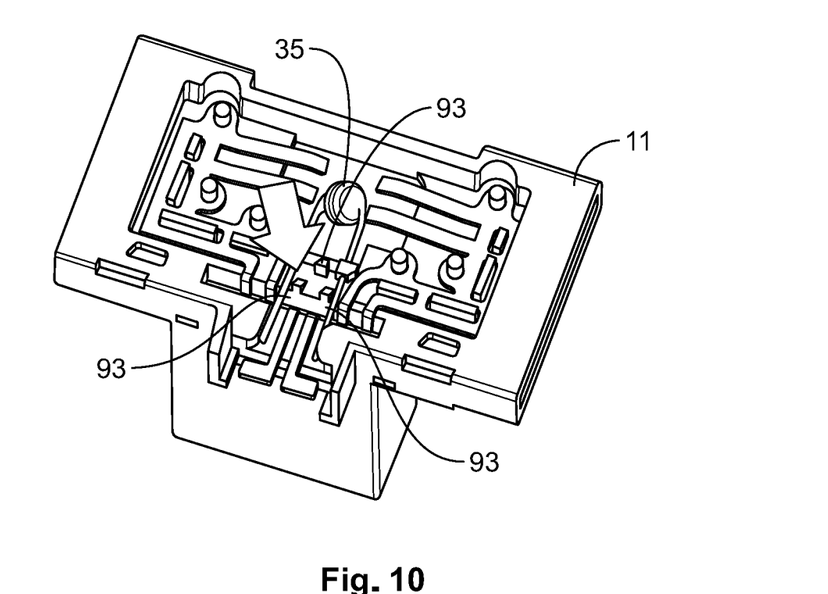
FIG. 10 is a perspective view of a second step of assembling the passive current sensor according to an embodiment.

In a further method step shown in FIG. 10, the temperature sensor 35 is inserted into the housing, wherein positioning pins 93 facilitate the positioning of the temperature sensor 35. Eventually, the temperature sensor 35 is fastened to the temperature contacting sections 45 of the temperature measuring contacts 21 by a direct electrical and mechanical connection 29.

Figure 11:
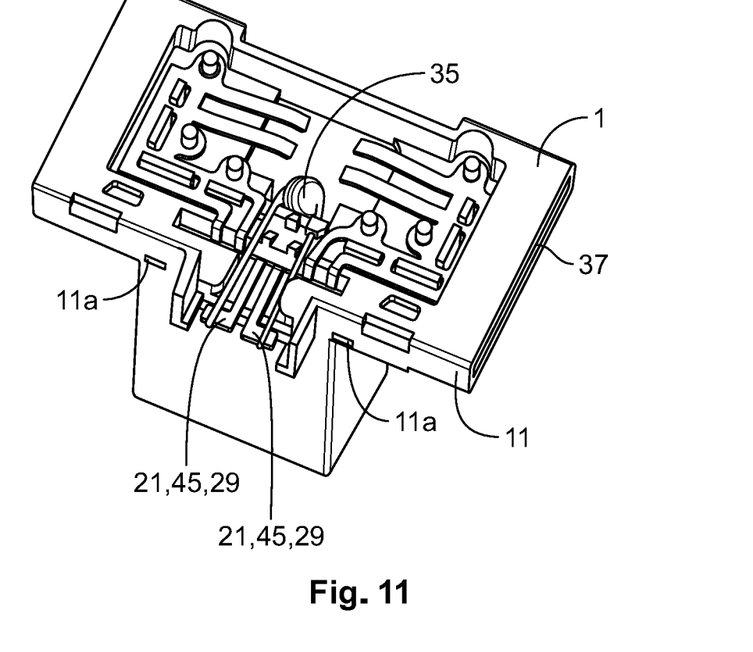
FIG. 11 is a perspective view of a third step of assembling the passive current sensor according to an embodiment.

When installing the shunt element 63, it is possible that its front edge strikes the very sensitive voltage drop measuring contacts 23. For this purpose, as shown in FIG. 11, lateral openings 11a can be provided in the housing 11. These openings 11a allow the measuring contacts 21, 23 to be raised using a tool, for example, a wedge plate, before the shunt element 63 is installed. The raising of the measuring contacts 21, 23 takes place into the drawing plane. After installation, the wedge plates can be removed, and so the measuring contacts 21, 23 spring back into the starting position and contact the inserted shunt element 63. Subsequently, the welding process can begin.

Figure 12:
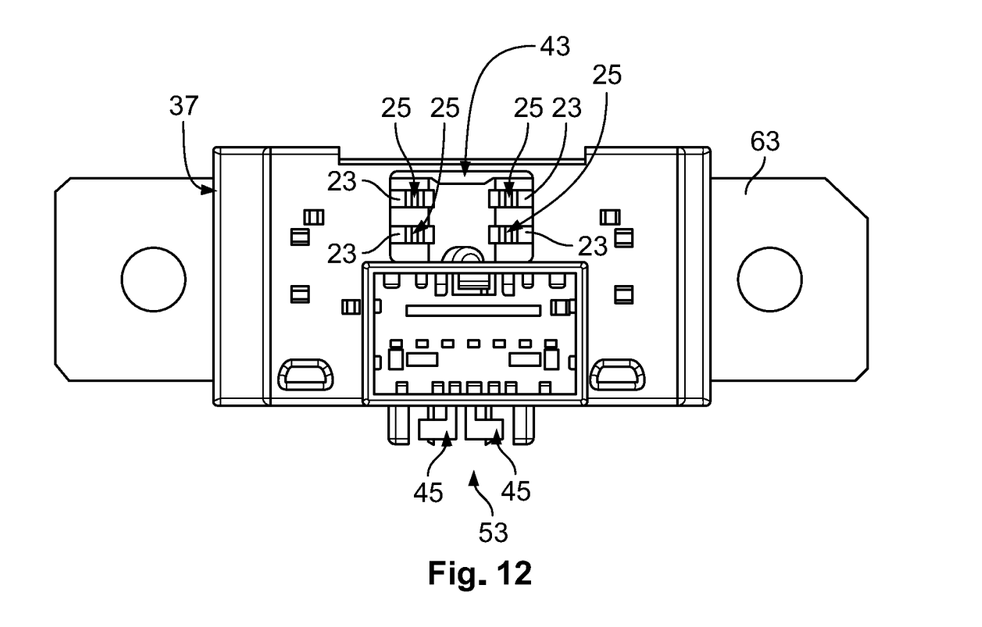
FIG. 12 is a plan view of a fourth step of assembling the passive current sensor according to an embodiment.

FIG. 12 shows the housing 11 of FIG. 11 after the shunt element 63 has been introduced laterally into the receiving link 37 of the housing 11. The connecting sections 25 of the four voltage drop measuring contacts 23 provided are accessible through an access recess 43. The temperature contacting sections 45 are accessible via a separately configured sensor access recess 53.

Figure 13:
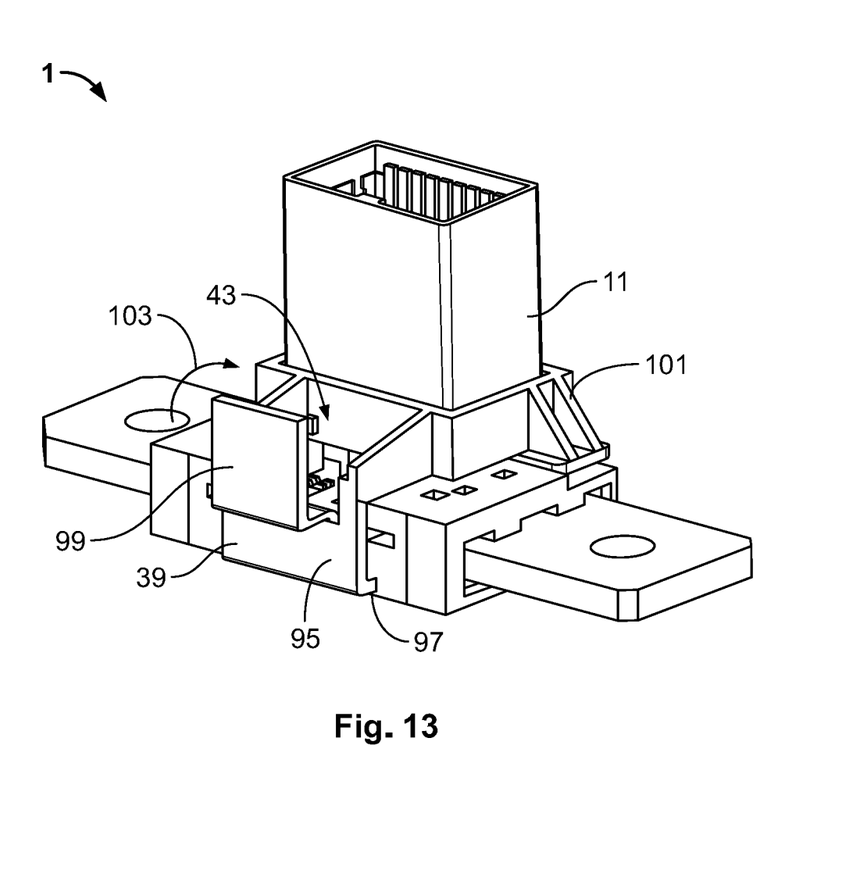
FIG. 13 is a perspective view of a passive current sensor according to another embodiment.

The passive current sensor 1 according to the invention can also have a further embodiment of the access protection 39, shown in FIG. 13 in the form of a secondary snap-in element 95. The secondary snap-in element 95 engages with snap-in elements 97 with the housing 11 and also has a foldable element 99 which can be folded over the access recess 43 and prevents access to the connecting sections 25, as shown in FIG. 12. The secondary snap-in element 95 shown in FIG. 13 covers the sensor access recess 53 with a rear flank 101. A folding movement 103 is shown schematically in FIG. 15.

Figure 14:
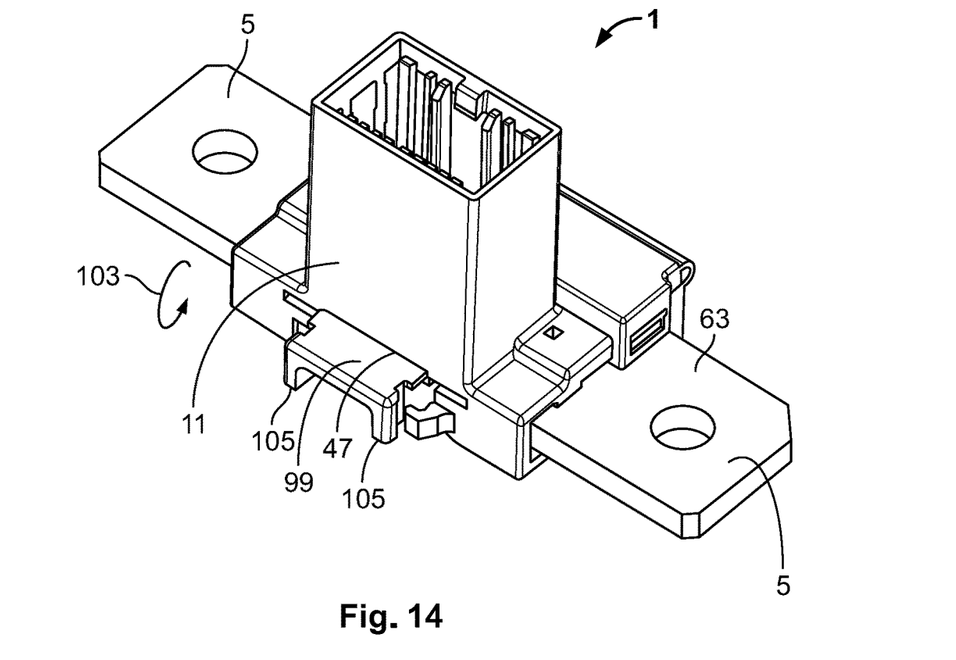
FIG. 14 is a perspective view of a passive current sensor according to another embodiment with a foldable element in an open state.
Figure 15:
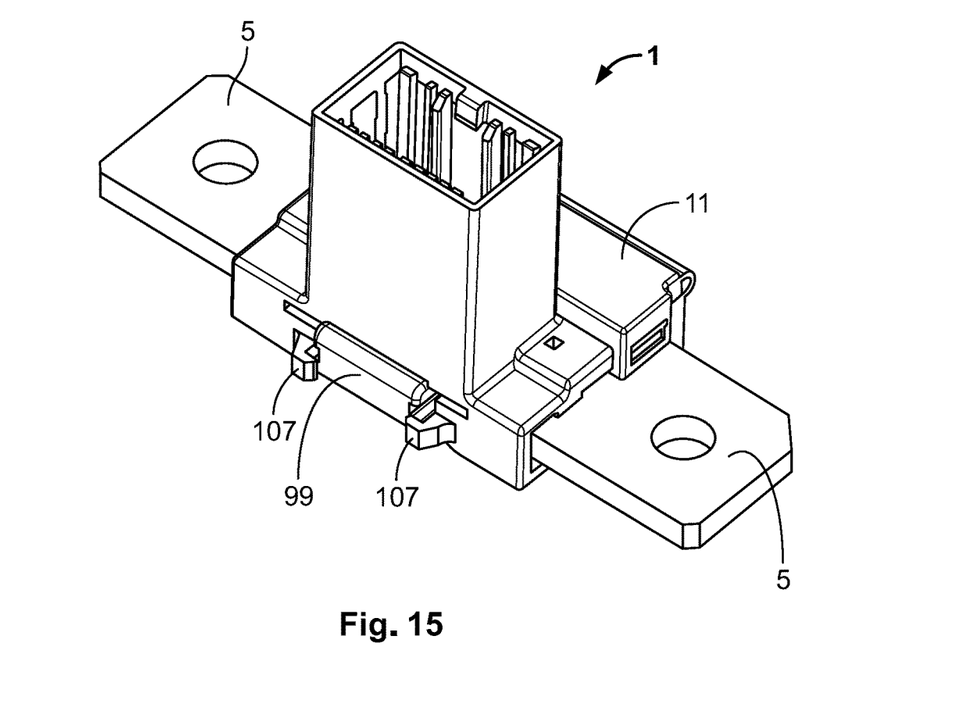
FIG. 15 is a perspective view of the passive current sensor of FIG. 14 with a folded foldable element.

FIGS. 14 and 15 show a further embodiment of the passive current sensor 1, which differs from the previous embodiments in that the housing 11 is engaged with the shunt element 63 by a second embodiment of the foldable element 99. This is also connected to the housing 11 by a film hinge 47. The foldable element 99 has stop elements 105 which, when the folding movement 103 is carried out about the film hinge 47, bear against one busbar 5 each and are pressed against the busbar 5. This is shown in FIG. 15, wherein the housing 11 also has further snap-in elements 107 which engage the foldable element 99 from behind, thus holding the stop elements 105 pressed against the busbars 5 and preventing the foldable element 99 from opening.

Figure 16:
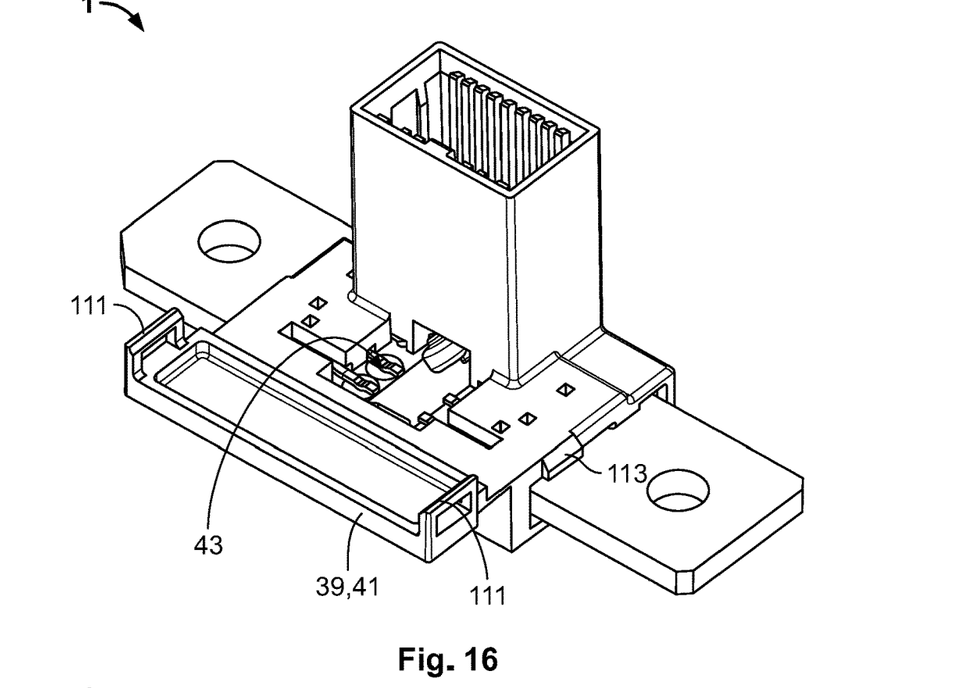
FIG. 16 is a perspective view of the passive current sensor of FIG. 14 with a cover element in an open state.
Figure 17:
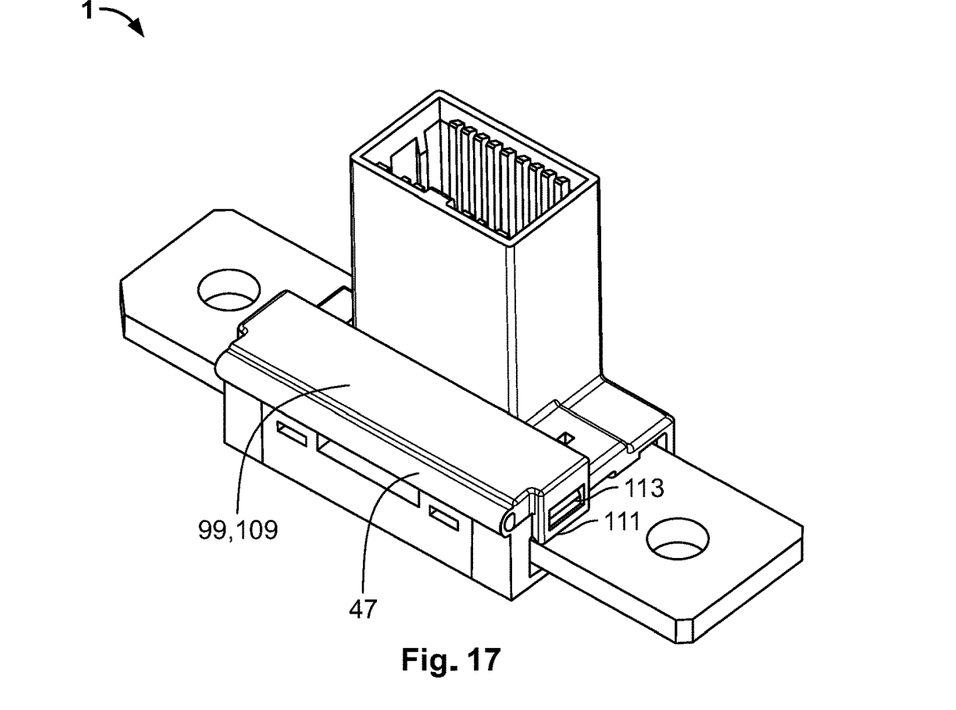
FIG. 17 is a perspective view of the passive current sensor of FIG. 16 with the cover element in a covered state.

FIGS. 16 and 17 show a different perspective view of the passive current sensor 1 according to the invention from FIGS. 14 and 15. The access recess 43, which is accessible in FIG. 16, can be seen. In order to close the access recess 43, the passive current sensor 1 has a second embodiment of the access protection 39 configured as a cover element 41. Its function essentially corresponds to that of the cover element 41 of the embodiment of the passive current sensor 1 shown in FIG. 1. The cover element 41 is also connected via a film hinge 47, but in other configurations, it can be realized by a differently configured hinge. In the covered state 109, the foldable element 99 engages by snap-in bars 111 which engage correspondingly in complementarily configured snap-in hooks 113 from behind.

In the passive current sensor 1 and assembly 61, no PCB is necessary; the contact pins 13 are directly connected to the busbars 5. Due to the direct contacting and electrical connection 29 of the contact pins 13 to the busbars 5, a welding process is possible, wherein welded connections can generally have a lower error rate. Furthermore, due to the PCB, which is no longer required, a component is saved, and instead of two connections, i.e., from the contact pin 13 to the PCB and from the PCB to the busbar 5, only a single electrical and mechanical connection 29 is required for connecting a contact pin 13. The current sensor 1 thus has a simpler structure than the solutions from the prior art, is more cost-effective, and can increase the service life of the passive current sensor 1 due to the more durable connection.

What is claimed is:

1. A passive current sensor, comprising:
   a pair of electrically conductive busbars;
   a shunt resistor electrically connecting the busbars; and
   a carrier having a first pair of voltage drop measuring contacts, at least one of the voltage drop measuring contacts is attached to each of the busbars and forms a direct electrical contact between the at least one voltage drop measuring contact and the busbar, the carrier is a housing in which the voltage drop measuring contacts are held.

2. The passive current sensor of claim 1, further comprising a second pair of voltage drop measuring contacts, one of the second pair of voltage drop measuring contacts is directly electrically and mechanically connected to a first busbar of the busbars and another of the second pair of voltage drop measuring contacts is directly electrically and mechanically connected to a second busbar of the busbars.

3. The passive current sensor of claim 1, wherein the carrier has a receiving link into which the busbars and the shunt resistor are inserted.

4. The passive current sensor of claim 3, wherein one of the busbars has a notch in which the carrier engages.

5. The passive current sensor of claim 1, further comprising a pair of temperature measuring contacts, each of the temperature measuring contacts is electrically insulated from the busbars and the shunt resistor.

6. The passive current sensor of claim 5, further comprising a temperature sensor electrically connected to the temperature measuring contacts and positioned near the shunt resistor.

7. The passive current sensor of claim 6, wherein an electrical temperature contacting section of the temperature measuring contacts and/or the temperature sensor is accessible via an access recess of the carrier.

8. The passive current sensor of claim 7, wherein the carrier has an access protection designed to close at least sections of the access recess.

9. The passive current sensor of claim 1, wherein the voltage drop measuring contacts are each directly electrically and mechanically connected to the busbars at a connecting section.

10. The passive current sensor of claim 9, wherein the connecting section of each of the voltage drop measuring contacts is accessible via an access recess of the carrier.

11. The passive current sensor of claim 1, wherein the voltage drop measuring contacts each have a bending area connecting a busbar contacting area of the voltage drop measuring contacts with a plug connecting area of the voltage drop measuring contacts.

12. The passive current sensor of claim 1, wherein the voltage drop measuring contacts are each held and/or secured in a pin-receiving opening of the carrier.

13. The passive current sensor of claim 1, further comprising a blind pin mechanically fixing a position of the carrier, the blind pin connected to at least one of the busbars and to the carrier.

14. The passive current sensor of claim 1, wherein the carrier is connected to at least one of the busbars by an undercut element and/or a snap-in element.

15. The passive current sensor of claim 1, wherein the housing has a plug face, the voltage drop measuring contacts are received and/or fastened within the plug face.

16. The passive current sensor of claim 1, wherein the passive current sensor does not include a printed circuit board.

17. An assembly for a passive current sensor, comprising:
    providing a carrier, a pair of voltage drop measuring contacts, and a pair of temperature measuring contacts;
    inserting the pair of voltage drop measuring contacts and the pair of temperature measuring contacts into a plurality of pin receiving openings of the carrier, the carrier is a housing in which the voltage drop measuring contacts and the temperature measuring contacts are held; and
    electrically and mechanically connecting a temperature sensor to the temperature measuring contacts.

18. The assembly of claim 17, further comprising a shunt element having a pair of electrically conductive busbars and a shunt resistor electrically connecting the busbars.

19. A passive current sensor, comprising:
    a pair of electrically conductive busbars;
    a shunt resistor electrically connecting the busbars; and
    a carrier having a first pair of voltage drop measuring contacts, at least one of the voltage drop measuring contacts is attached to each of the busbars and forms a direct electrical contact between the at least one voltage drop measuring contact and the busbar, the voltage drop measuring contacts are each directly electrically and mechanically connected to the busbars at a connecting section, the connecting section of each of the voltage drop measuring contacts is accessible via an access recess of the carrier.

20. A passive current sensor, comprising:
    a pair of electrically conductive busbars;
    a shunt resistor electrically connecting the busbars;
    a carrier having a first pair of voltage drop measuring contacts, at least one of the voltage drop measuring contacts is attached to each of the busbars and forms a direct electrical contact between the at least one voltage drop measuring contact and the busbar;
    a pair of temperature measuring contacts, each of the temperature measuring contacts is electrically insulated from the busbars and the shunt resistor; and
    a temperature sensor electrically connected to the temperature measuring contacts and positioned near the shunt resistor, an electrical temperature contacting section of the temperature measuring contacts and/or the temperature sensor is accessible via an access recess of the carrier.

21. The passive current sensor of claim 20, wherein the carrier has an access protection designed to close at least sections of the access recess.

* * * * *